United States Patent [19]
Roche et al.

[11] Patent Number: 5,913,140
[45] Date of Patent: Jun. 15, 1999

[54] METHOD FOR REDUCTION OF PLASMA CHARGING DAMAGE DURING CHEMICAL VAPOR DEPOSITION

[75] Inventors: Gregory A. Roche, Sunnyvale; David T. Hodul, Oakland; Vahid Vahedi, Albany, all of Calif.

[73] Assignee: Lam Research Corporation, Fremont, Calif.

[21] Appl. No.: 08/780,027

[22] Filed: Dec. 23, 1996

[51] Int. Cl.$^6$ ................................................. H01L 21/316
[52] U.S. Cl. ........................... 438/624; 438/761; 438/788
[58] Field of Search .................................... 438/788, 789, 438/624, 761

[56] References Cited

U.S. PATENT DOCUMENTS

| | | | |
|---|---|---|---|
| 4,481,229 | 11/1984 | Suzuki et al. | 438/788 |
| 4,732,761 | 3/1988 | Machida et al. | 437/228 |
| 5,032,535 | 7/1991 | Kamijo et al. | 437/44 |
| 5,124,014 | 6/1992 | Foo et al. | 204/192.32 |
| 5,160,998 | 11/1992 | Itoh et al. | 257/760 |
| 5,246,887 | 9/1993 | Yu | 438/789 |
| 5,252,520 | 10/1993 | Kocmanek et al. | 437/235 |
| 5,273,936 | 12/1993 | Ikeda | 437/180 |
| 5,279,865 | 1/1994 | Chebi et al. | 427/574 |
| 5,286,518 | 2/1994 | Cain et al. | 427/96 |
| 5,429,995 | 7/1995 | Nishiyama et al. | 438/788 |
| 5,552,346 | 9/1996 | Huang et al. | 437/228 |
| 5,679,606 | 10/1997 | Wang et al. | 437/195 |
| 5,723,386 | 3/1998 | Ishikawa | 438/787 |

FOREIGN PATENT DOCUMENTS

| | | |
|---|---|---|
| 63-80538 | 4/1988 | Japan . |
| 63-156340 | 6/1988 | Japan . |
| 2-216851 | 8/1990 | Japan . |

OTHER PUBLICATIONS

Gabriel et al., "Gate Oxide Damage Reduction Using a Protective Dielectric Layer," IEEE Electron Device Letters, vol. 15, No. 8, Aug. 1994, pp. 269–271.

Denison et al., "High Throughput Intermetal Dielectric Deposition of $SiO_2$ Utilizing a Two–Step High Density Plasma CVD Process," 1995 ISMIC–101D/95/0318, DUMIC Conference, Feb. 21–22, 1995, pp. 318–324.

Bothra et al., "Control of Plasma Damage to Gate Oxide During High Density Plasma Chemical Vapor Deposition," J. Electrochem. Soc., vol. 142, No. 11, Nov. 1995, pp. L208–L211.

Lee, Hong H., *Fundamentals of Microelectronics Processing*, McGraw–Hill, New York, pp. 383–387, 1990.

Primary Examiner—Charles Bowers
Assistant Examiner—Matthew Whipple
Attorney, Agent, or Firm—Martine Penilla & Kim, LLP

[57] ABSTRACT

A graded gap fill process in which, in a high density plasma processing chamber, an insulating layer is deposited on a substrate without causing plasma charge-related damage to the substrate. The insulating layer is disposed above a first layer having trenches formed therein and below a subsequently deposited second layer. A protection layer is first deposited above the first layer using a first set of deposition parameters. This protection layer coats a surface of the first layer in a substantially conformal manner without forming voids in the trenches. A fill layer is then deposited above the protection layer using a second set of deposition parameters. The first set of deposition parameters is selected to reduce plasma charge-related damage relative to the second set of deposition parameters. The combination of the protection layer and the fill layer sufficiently electrically isolates the first layer from the second layer.

8 Claims, 5 Drawing Sheets

METHOD FOR REDUCTION OF PLASMA CHARGING DAMAGE DURING CHEMICAL VAPOR DEPOSITION

BACKGROUND OF THE INVENTION

The present invention relates to the fabrication of semiconductor integrated circuits (IC's). More particularly, the present invention relates to a method of depositing an insulating layer on a semiconductor substrate using a high density plasma reactor which reduces the damage to the substrate caused by plasma charging.

Advanced MOS devices require multiple levels of metal interconnections and reduced feature sizes of less than 0.5 micron. These requirements place severe demands on the intermetal dielectric insulating films. Such insulating films must have good film integrity, must demonstrate good gap fill capability for structures with gaps less than 0.4 micron wide, and must be deposited at rates sufficient to maintain adequate throughput. Recent developmental efforts have found that $SiO_2$ films deposited by high density plasma chemical vapor deposition (CVD) processes meet these film requirements.

One known high density plasma CVD process is conducted in an electron cyclotron resonance (ECR) reactor. FIG. 1 shows a typical ECR system 100 known in the art. A substrate 106 rests on a chuck 104 disposed inside a plasma chamber 116. Chuck 104 may be either an electrostatic chuck (ESC) or a mechanical chuck and may be biased by a RF generator 102. A turbomolecular pump 110 controls the flow of hydrogen inside plasma chamber 116. A wave guide 112 brings microwaves inside source chamber 114, which is located above plasma chamber 116. Large magnets 108 surrounding source chamber 114 generate a magnetic field that sets up a resonance zone inside the source chamber, where the electrons gyrate at the same frequency as the microwave. As a result, a plasma is generated below the source and spreads out following the magnetic field lines representatively shown as lines 120 and 122 inside plasma chamber 116 and onto substrate 106. Outer magnet 124 and inner magnet 126 are used to fine focus this plasma.

In the formation of an $SiO_2$ film, oxygen and argon gases are fed into source chamber 114. An ion beam of argon and oxygen is extracted from source chamber 114 and is directed toward substrate 106. Silane ($SiH_4$) is fed into plasma chamber 116 through manifold 118 as shown in FIG. 1. The silane is absorbed onto the surface of substrate 106 and reacts with oxygen ions to form the $SiO_2$ film.

A conventional gap fill recipe for filling gaps less than 0.4 micron wide in structures with an aspect ratio greater than 2 (the aspect ratio of a space to be filled being defined by the height of the space divided by the width of the space) calls for the application of sufficient RF power, generally about 1450 W to about 1750 W for an 8 inch wafer at normal gas flow rates, to obtain an etch to deposition (E/D) ratio of about 32%. The B/D ratio is defined as the deposition rate reduction due to RF sputter etching divided by the deposition rate without sputter etching. Thus, a higher E/D ratio provides better gap fill capability but at the cost of lower deposition rate. The application of RF power causes sputter etching by the argon ion beam to occur on the surface of the substrate. This argon sputter etch preferentially occurs at a 45° angle which leads to faceting at the corners of exposed surfaces. As a result, the deposited film does not neck off or "breadloaf" at the tops of metal lines and cause voids to be formed in the film. The E/D ratio of 32% optimizes the gap fill capability of the deposited film while satisfying the need to maintain adequate throughput.

The continuing trend in advanced MOS devices is toward the use of extremely thin gate oxides having a thickness of about 40 angstroms. Unfortunately, the conventional gap fill recipe using an E/D ratio of 32% cannot be used in the fabrication of such IC's because damage to thin gate oxides may occur during deposition of the gap fill layer. This damage may result from the high ion current, $J_i$, of high density plasma. If the plasma is not uniform across the substrate, then a current imbalance occurs in the substrate. The application of RF power, which itself is somewhat intrinsically nonuniform, causes a voltage to build up in the substrate. This voltage allows the current from the plasma to flow in the substrate to the gate oxides of underlying MOS transistors. Unfortunately, when the amount of current exceeds the capacity of the gate oxide, damage to the gate oxides may occur leading to gate leakage or oxide breakdown.

In an attempt to prevent such charging damage to gate oxides from occurring during high density plasma CVD processing, it has been proposed to first deposit an oxide protection layer without the application of RF power, i.e., a zero bias protection layer. Such a protection layer, however, is nonconformal in that it tends to "breadloaf" at the tops of metal lines. Referring to FIG. 2, substrate 200 includes structures 202 defining trenches 204 therebetween. Zero bias protection layer 206 builds up at the top corners of structures 202 and necks off trenches 204 which results in the formation of voids 208. Unfortunately, this effect may become even more pronounced when filling gaps having dimensions that are less than about 0.4 micron wide with an aspect ratio greater than 2. Furthermore, sidewall coverage is very thin and the dielectric integrity of the layer is relatively low. Consequently, a zero bias protection layer is not acceptable for use in filling gaps less than about 0.4 micron wide.

In view of the above, what is needed are methods and apparatuses for depositing a high quality (i.e., high dielectric integrity) insulating layer to fill gaps between high aspect ratio structures (i.e., structures having an aspect ratio greater than 2) using a high density plasma CVD process which prevents or reduces damaging side effects to the underlying substrate caused by plasma charging.

SUMMARY OF THE INVENTION

The present invention fills this need by providing a graded gap fill process to fill gaps between high aspect ratio structures using a high density plasma CVD process without causing plasma charge-related damage to the underlying substrate.

In accordance with one aspect of the present invention, a method of depositing an insulating layer on a substrate in a high density plasma processing chamber is provided. The insulating layer is disposed above a first layer having trenches formed therein and below a subsequently deposited second layer. A protection layer is deposited above the first layer using a first set of deposition parameters. This protection layer coats a surface of the first layer in a substantially conformal manner without forming voids in the trenches. A fill layer is then deposited above the protection layer using a second set of deposition parameters. The first set of deposition parameters is selected to reduce plasma charge-related damage relative to the second set of deposition parameters. The combination of the protection layer and the fill layer sufficiently electrically isolates the first layer from the second layer.

In one preferred embodiment, the first set of deposition parameters includes reduced RF power. Alternatively, the first set of deposition parameters may include reduced $J_i$ or reduced gas flow. Reduced $J_i$ can be obtained by reducing the microwave output, increasing the pressure in the plasma chamber, or a combination of these parameters. In a still further alternative, the first set of deposition parameters may include a combination of reduced RF power, reduced $J_i$, and reduced gas flow.

The second set of deposition parameters corresponds to the conventional high RF gap fill recipe, which has an E/D ratio of about 32% to optimize gap fill capability while maintaining adequate throughput.

In accordance with another aspect of the invention, an intermediate layer is deposited above the protection layer using a third set of deposition parameters. The fill layer is then deposited above the intermediate layer. The third set of deposition parameters is selected to increase throughput relative to the first set of deposition parameters used to deposit the protection layer. In one preferred embodiment, the third set of deposition parameters includes a RF power higher than that included in the first set of deposition parameters.

In accordance with a still further aspect of the present invention, a microelectronic device is provided which includes an insulating layer disposed above an active layer having trenches formed therein. The insulating layer includes a protection layer coating a surface of the active layer and a fill layer disposed above the protection layer. In one preferred embodiment, the insulating layer further includes an intermediate layer disposed between the protection layer and the fill layer.

These and other features and advantages of the present invention will become apparent upon reading the following detailed description and studying the various figures of the drawings.

DETAILED DESCRIPTION OF THE PREFERRED EMBODIMENTS

An invention is described for a graded gap fill process in which, in a high density plasma processing chamber, an insulating layer is deposited on a substrate without causing plasma charge-related damage to the substrate. In the following description, numerous specific details are set forth to provide a thorough understanding of the present invention. It will be obvious to one skilled in the art, however, that the present invention may be practiced without some or all of these specific details. In other instances, well known process steps have not been described in detail so as not to unnecessarily obscure the present invention.

In accordance with one aspect of the present invention, the above-described plasma charging damage problem is substantially alleviated by first depositing a protection layer which has sufficient dielectric integrity to protect the underlying substrate from damage caused by plasma charging. A fill layer is then deposited above the protection layer in accordance with a conventional gap fill recipe. The protection layer and the fill layer may be formed of known insulating materials including, but not limited to, $SiO_2$, $Si_xN_y$, SiOF (FSG), phosphosilicate glass (PSG), and borophosphosilicate glass (BPSG). The inventive method may be performed in known high density plasma processing apparatuses such as ECR and TCP™ (transformer coupled plasma) processing systems.

Figure 1:
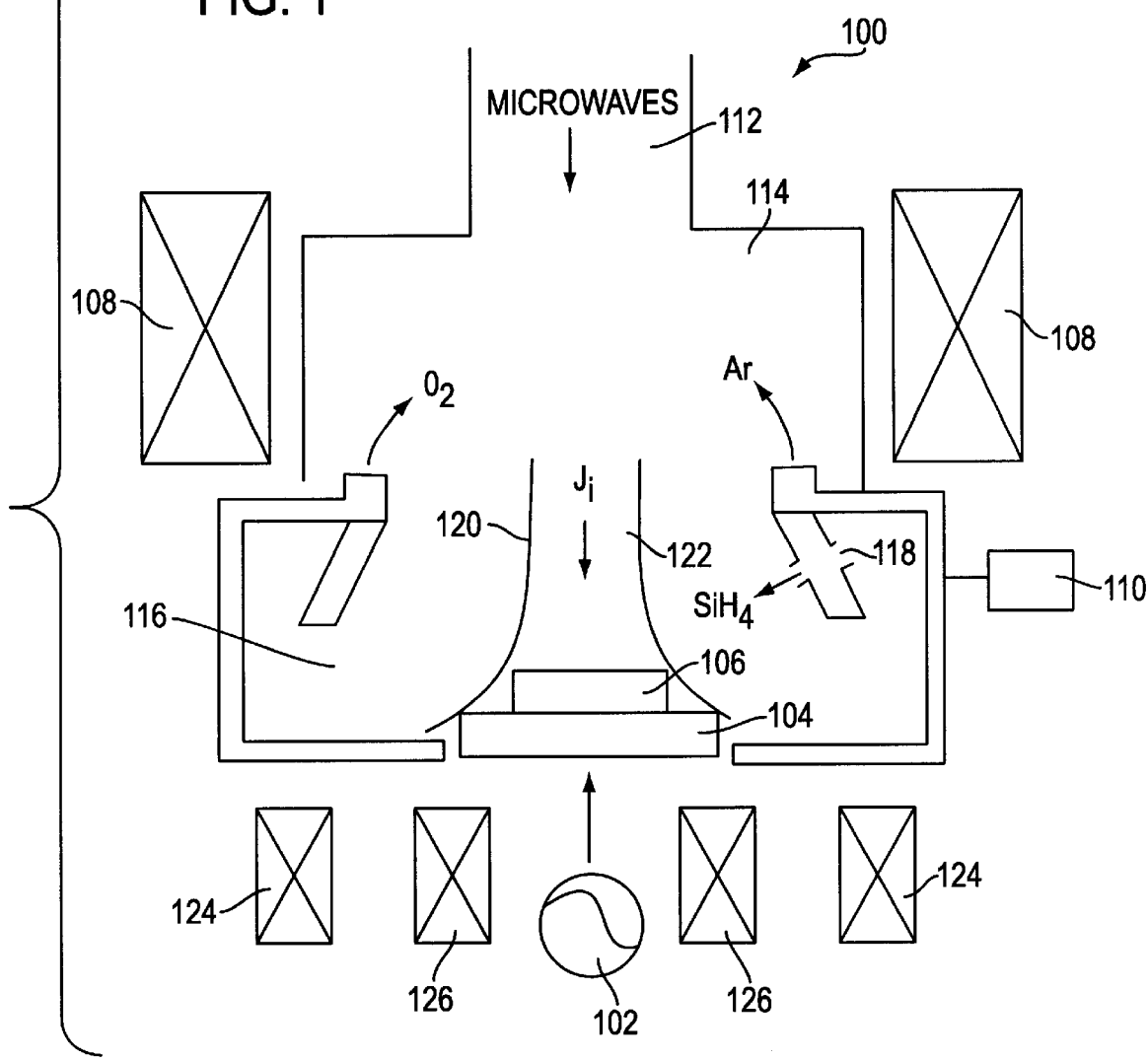
FIG. 1 is a simplified schematic diagram of a typical electron cyclotron resonance (ECR) system used for high density plasma chemical vapor deposition (CVD) processing.
Figure 2:
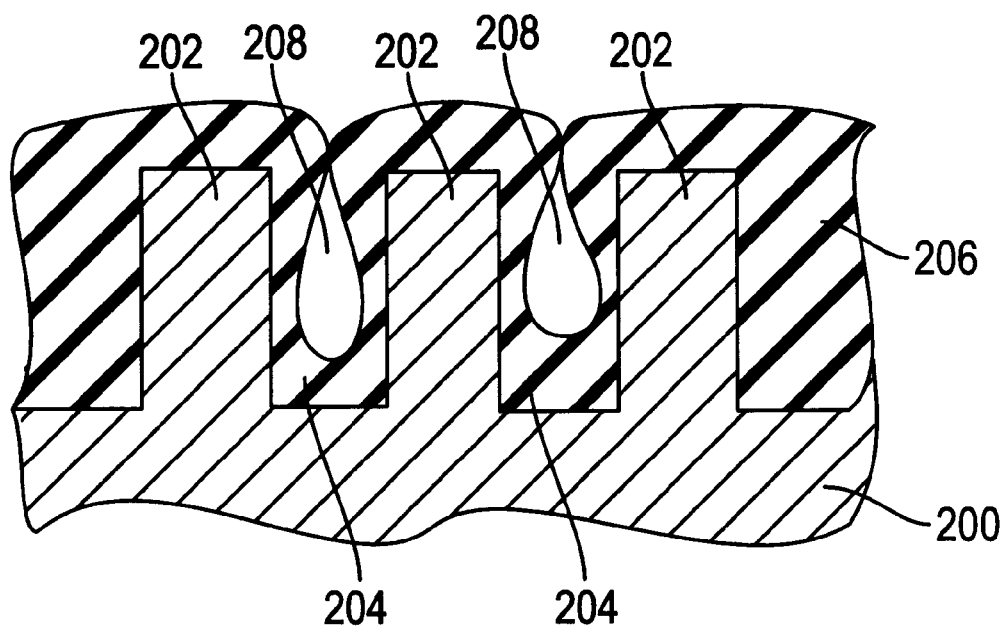
FIG. 2 is a cross-sectional view of a zero bias protection layer deposited on a substrate having structures formed therein which illustrates the formation of voids caused by necking off or "breadloafing" of such layer.
Figure 3A:
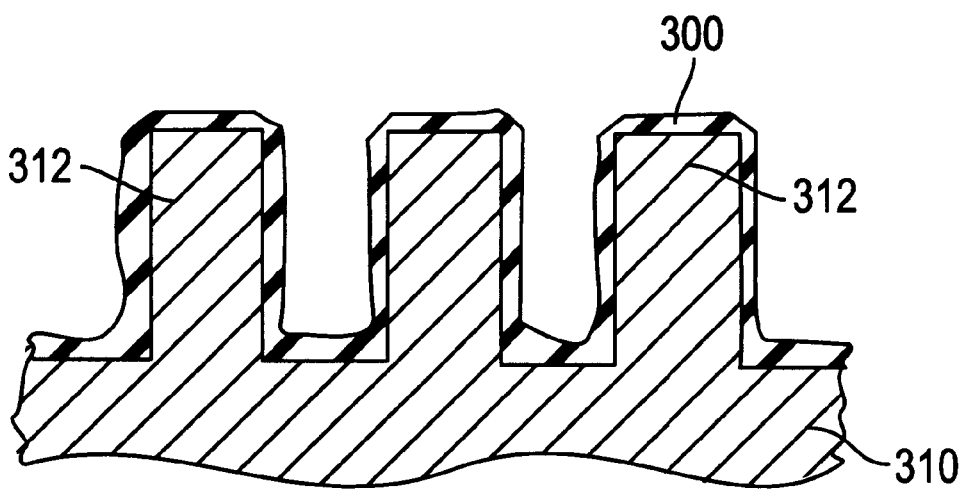
FIG. 3A is a cross-sectional view of a protection layer formed in accordance with one embodiment of the present invention.
Figure 3B:
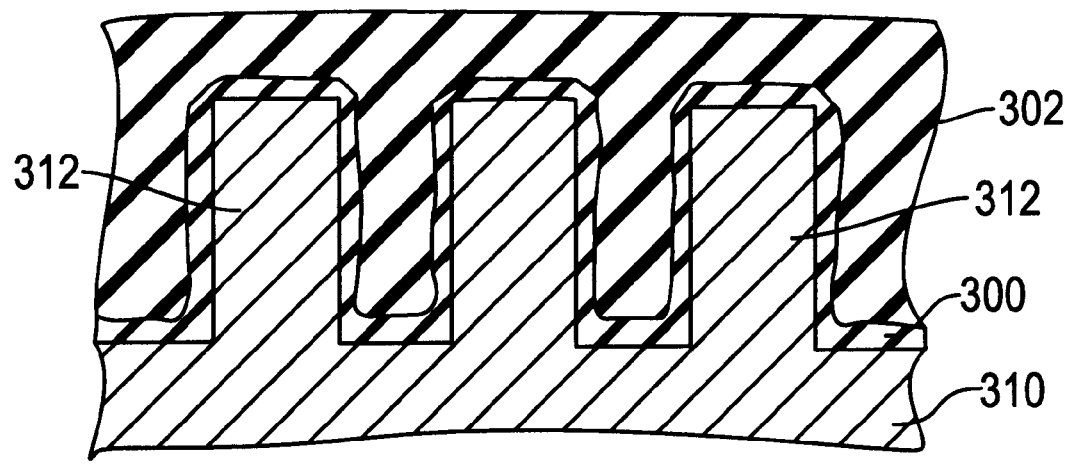
FIG. 3B is a cross-sectional view of a protection layer and a fill layer formed in accordance with one embodiment of the present invention.

FIG. 3A shows a protection layer 300 formed on substrate 310, which may be a semiconductor wafer or other substrate material. As used in connection with the description of the invention, the term "substrate" includes the wafer and the active devices (e.g., which may include active layers) formed thereon such as, for example, transistors and metallization interconnect lines. Structures 312 define gaps or trenches in the surface of substrate 310. As will be explained in detail below, the deposition parameters used to deposit protection layer 300 are controlled such that layer 300 coats the surface of substrate 310 in a substantially conformal manner and has high dielectric integrity. In one embodiment, FIG. 3B shows a fill layer 302 deposited above protection layer 300. As illustrated in FIG. 3B, fill layer 302 is deposited until the gaps or trenches are filled and a planar surface is obtained above the top surfaces of structures 312. In one embodiment, the gaps or trenches may represent gaps formed between metallization lines. At this point, a sacrificial layer referred to as a "high rate" film may be deposited in accordance with conventional practice. Fill layer 302 is deposited in accordance with the conventional gap fill recipe which, as described above, uses an E/D ratio of about 32%.

Figure 3C:
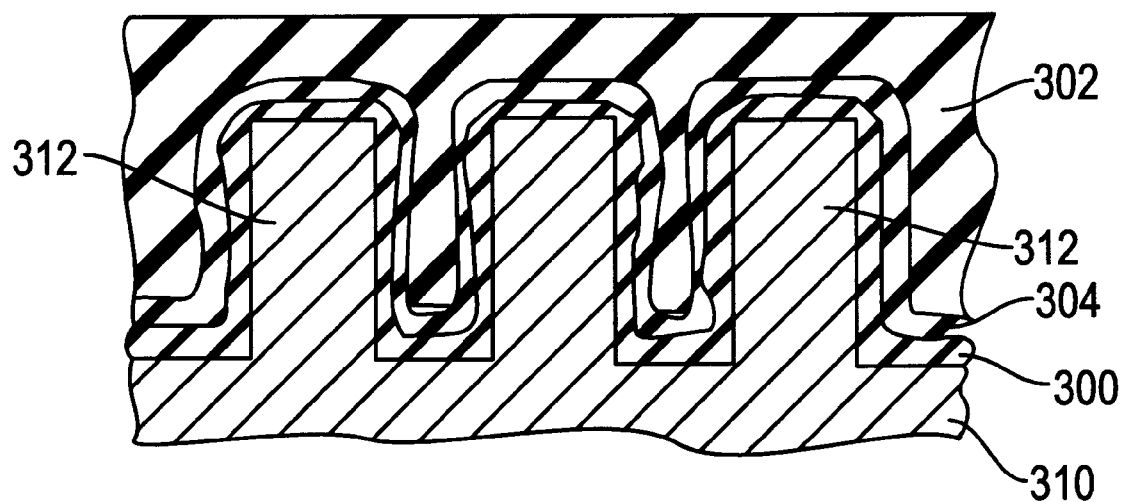
FIG. 3C is a cross-sectional view of a protection layer, an intermediate layer, and a fill layer formed in accordance with another embodiment of the present invention.

FIG. 3C shows, in accordance with another aspect of the present invention, an intermediate layer 304 disposed between protection layer 300 and fill layer 302. The purpose of intermediate layer 304 is to provide a layer having properties in between those of protection layer 300 and fill layer 302. The use of an intermediate layer is particularly advantageous in situations where the topography requires a higher amount of sputtering to avoid necking off the gaps. In such instances, the use of an intermediate layer helps achieve the gap fill while maintaining adequate throughput.

Figure 4:
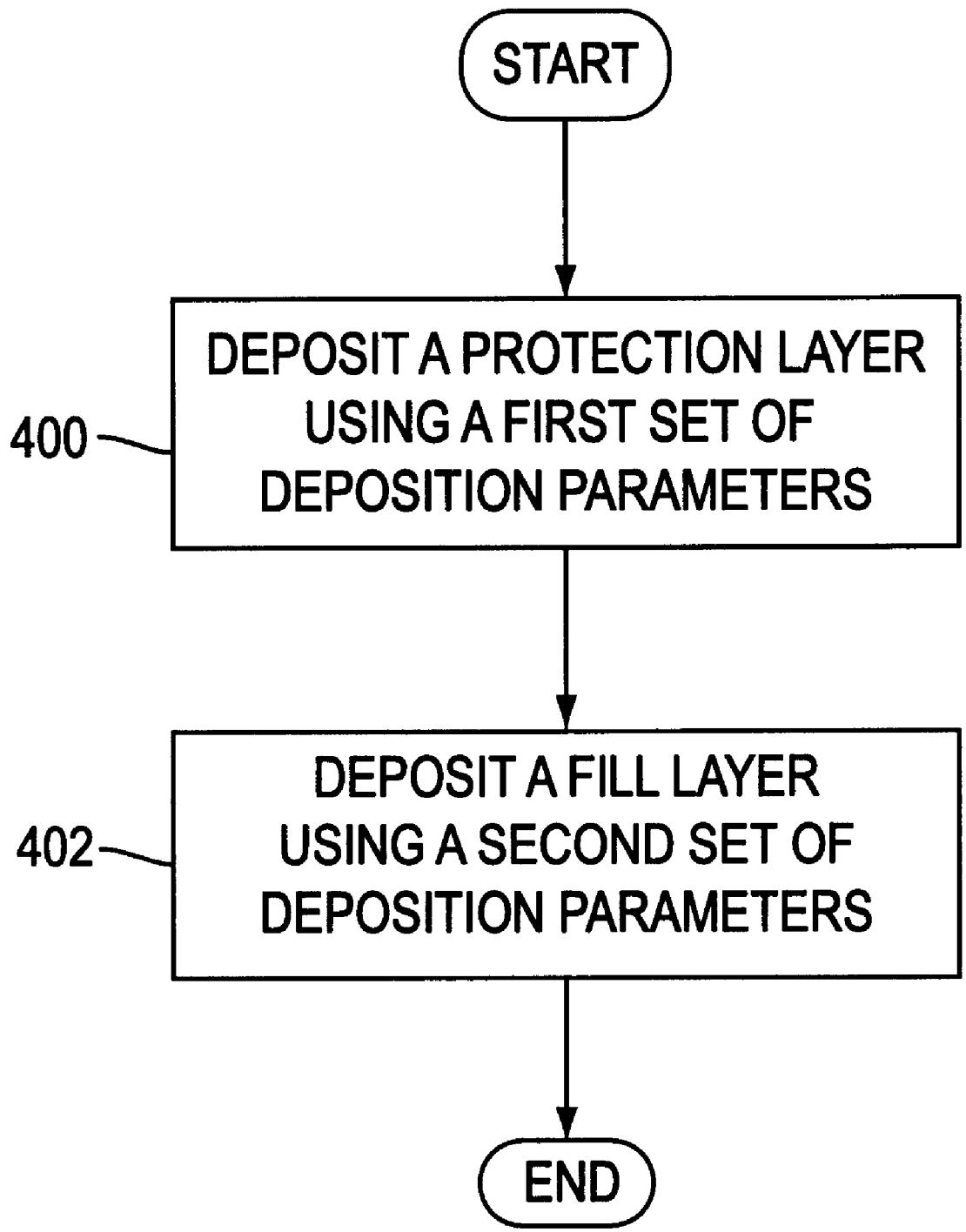
FIG. 4 shows, in accordance with one embodiment of the present invention, the steps involved in the inventive graded gap fill process.

FIG. 4 shows, in accordance with one aspect of the invention, the steps involved in the inventive graded gap fill process. In step 400, a protection layer is deposited using a first set of deposition parameters. This first set of deposition parameters is selected to minimize the current to which the substrate is exposed while still obtaining adequate fill of the specific topography in question. In addition, to protect the underlying substrate from plasma charge-related damage, the protection layer must be thick enough to protect the metal lines by blocking current flow and have sufficient dielectric integrity to withstand the voltage on the substrate. To fulfill these requirements, the protection layer is preferably deposited under low bias conditions, i.e., at low RF power relative to that used in the conventional gap fill recipe.

In a preferred embodiment in an ECR reactor at normal gas flow rates, the protection layer is deposited using a RF power within the range of between about 50 W and about 350 W. In a more preferred range, the RF power is applied between about 150 W and about 250 W. The use of these relatively low RF power levels, which result in the deposition of a film having a low E/D ratio (e.g., about 3% or less), advantageously exposes the substrate to a lower current dose (which is a function of current x time) at the onset of deposition relative to the conventional high RF gap fill recipe. Furthermore, using the lower E/D ratio film for as long as possible at the onset of deposition provides higher throughput because lower E/D ratio films have a higher growth rate (due to the reduced effect of the sputtering component).

As described above, the thickness of the protection layer is selected to provide adequate protection for the underlying substrate. In this embodiment, the thickness selected is dependent on the specific substrate topography in question. In general, however, a thickness corresponding to about 20% of the total thickness of the insulating layer has been found to provide adequate protection during deposition in an ECR reactor. By way of example, in specific instances, a protection layer having a thickness of between about 200 nm and about 300 nm may be sufficient to protect the substrate from plasma charge-related damage. Those skilled in the art will recognize that the thickness of the protection layer may be varied to accommodate a variety of substrate topographies.

As an alternative to reducing the RF power to deposit the protection layer, other deposition parameters may be varied to minimize the current dose to which the substrate is exposed during deposition of the protection layer. For example, $J_i$ may be reduced by either reducing the microwave output or increasing the pressure in the plasma chamber. In an ECR reactor, it has been found that reducing the microwave output to within the range of between about 1000 W and about 1400 W, or increasing the pressure from about 2 mTorr to nominally between about 6 and about 10 mTorr sufficiently reduces $J_i$ such that a protection layer may be deposited without causing plasma charge-related damage to the substrate. Increasing the pressure is generally not a preferred method of depositing the protection layer, however, because a loss of deposition rate results from the loss of ion current reaching the surface of the substrate.

As a further alternative, the deposition gas flows may be adjusted to adjust the deposition rate and, consequently, adjust the E/D ratio. By way of example, in the deposition of an $SiO_2$ protection layer in an ECR reactor, the gas flows of $O_2$, Ar, and $SiH_4$ may be reduced to approximately one half of normal flow. This method of depositing the protection layer is also generally not a preferred method because it changes the properties of the film (e.g., stress and index of refraction) to a greater extent than do changes to the RF power or microwave output. Those skilled in the art will recognize that the above-described deposition parameters including reduced RF power, reduced $J_i$ (obtained by reducing the microwave output or increasing the pressure in the plasma chamber), and reduced gas flows also may be varied in combination to deposit the protection layer.

After a sufficiently thick protection layer has been deposited, in step 402 a fill layer is deposited using a second set of deposition parameters. This second set of deposition parameters corresponds to the conventional gap fill recipe which, as described above, includes the use of high RF power (e.g., between about 1450 W and about 1750 W) to obtain an E/D ratio of about 32%. In accordance with conventional practice, the fill layer is deposited to the tops of metal lines as shown in FIG. 3B. During deposition of the fill layer, the protection layer protects the underlying substrate from plasma charge-related damage caused by the increased RF power needed to provide the requisite amount of sputtering to complete the gap fill.

Figure 5:
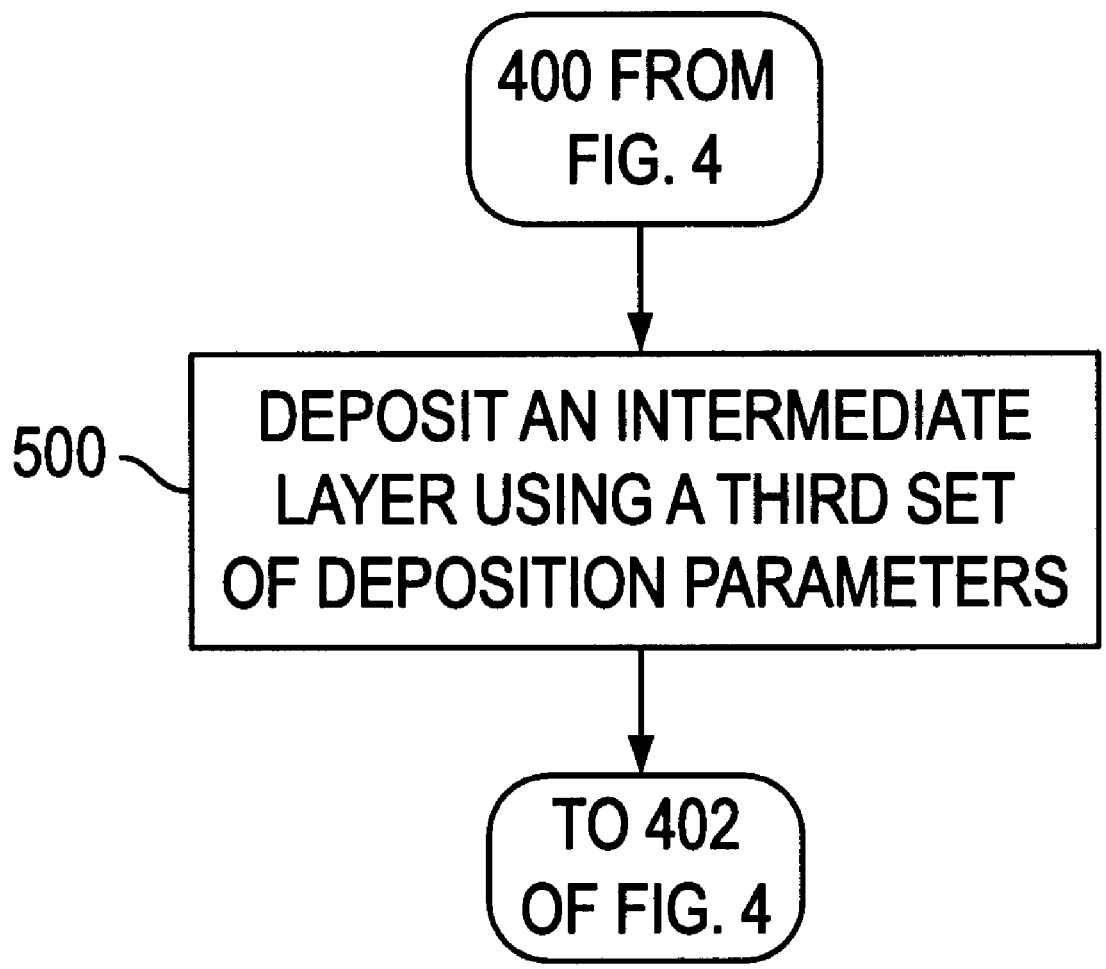
FIG. 5 shows, in accordance with another embodiment of the invention, an additional step involved in the inventive graded gap fill process to form an intermediate layer.

FIG. 5 shows an additional step that may be performed when the inventive graded gap fill process includes an intermediate layer as described with reference to FIG. 3C. In step 500, which is shown being performed between steps 400 and 402 of FIG. 4, an intermediate layer is deposited using a third set deposition parameters. This third set of deposition parameters is selected to increase throughput relative to the first set of deposition parameters used to deposit the protection layer. To fulfill this requirement, the intermediate layer is preferably deposited using a RE power higher than that used to deposit the protection layer.

In a preferred embodiment, in an ECR reactor operated at normal gas flow rates, the intermediate layer is deposited using a RF power within the range of between about 350 W and about 650 W. A more preferred range for the RF power is between about 450 W and about 550 W. The use of such RF power levels preferably results in the deposition of a film having an E/D ratio of about 17%, which is roughly midway between the low E/D ratio (e.g., about 3% or less) of the protection layer and the E/D ratio (e.g., about 32%) of the fill layer. This intermediate E/D ratio is selected to provide some gap fill capability while maintaining low enough RF power levels so as not to damage a structure with a particular protection layer thereon. The deposition rate and hence the throughput is higher for this intermediate layer because the E/D ratio is lower.

Those skilled in the art will recognize that the intermediate layer also may be deposited to obtain higher throughput relative to the protection layer by varying other deposition parameters such as $J_i$, pressure, and gas flow. For example, $J_i$ can be increased relative to that used to deposit the protection layer by increasing the microwave output or reducing the pressure in the plasma chamber. Those skilled in the art will further recognize that various combinations of these deposition parameters can be used to deposit the intermediate layer to obtain higher throughput relative to the protection layer.

The combined thickness of the protection layer and the intermediate layer needed to provide adequate protection for the underlying substrate while obtaining higher throughput depends on the specific substrate topography in question. In general, however, a combined thickness corresponding to about 20% of the total thickness of the insulating layer has been found to satisfy these protection and throughput requirements during deposition in an ECR reactor. In a preferred embodiment in an ECR reactor, the protection layer and the intermediate layer each have a thickness of about 10% of the total thickness of the insulating layer. Those skilled in the art will recognize that the thickness of the protection layer and the intermediate layer may be varied to accommodate particular substrate topographies and to meet particular throughput requirements. Those skilled in the art will further recognize that in specific instances it may be beneficial to provide more than one intermediate layer. For example, it may be beneficial in certain circumstances to form a protection layer having a thickness corresponding to about 5% of the total thickness of the insulating layer followed by a plurality of intermediate layers each having a thickness corresponding to about 5% of the total thickness of the insulating layer.

A further aspect of the present invention is the microelectronic devices obtained by practice of the graded gap fill process disclosed herein. Such microelectronic devices have an insulating layer including a protection layer coating a surface of an active layer having trenches formed therein in a substantial conformal manner as shown in FIGS. 3A–3C. The insulating layer also includes a fill layer disposed above the protection layer as shown in FIGS. 3B and 3C. If desired, the insulating layer may further include an intermediate layer disposed between the protection layer and the fill layer as shown in FIG. 3C.

EXAMPLES

The graded gap fill process of the present invention will now be described in terms of specific examples. It should be borne in mind that the examples given below are merely illustrative of particular applications of the inventive graded gap fill technique and should in no way be construed to limit the usefulness of the invention when applied with other wafers, other high density plasma processing systems, or other deposition parameters. For example, although the following parameters are associated with an exemplary "6 inch wafer" or an exemplary "8 inch wafer," the parameters may be modified for application to substrates of varying sizes and shapes such as those employed in the manufacture of semiconductor devices and flat panel displays.

Example 1

Two-layer $SiO_2$ graded gap fills including a protection layer and a fill layer of varying thicknesses were deposited on a 6 inch wafer in an Epic ECR reactor. The recipe is shown below in Table 1. Steps 1–4 are stability and preheat steps. Steps 5–7 are transitional steps during which the pressure is increased from zero Torr (the condition when the turbomolecular pump is fully open) to about 6 mTorr. In step 8, the protection layer was deposited using, among the other parameters, a RF power of about 200 W and a microwave output of about 1200 W. In step 9, the fill layer was deposited using the same deposition parameters as in step 8 except that the RF power was increased from about 200 W to about 500 W. Steps 10–12 are cool down and wafer removal steps.

on an 8 inch wafer in an Epic ECR reactor. The recipe is shown below in Table 2. It should be understood that at least some of the parameters presented in Table 2 have been calculated based on results obtained through performance and evaluation of actual depositions. As described above in connection with Example 1, steps 1–4 are stability and preheat steps and steps 5–7 are transitional steps. In step 8, the protection layer was deposited using, among other deposition parameters, a RF power of about 200 W and a microwave output of about 1200 W. In step 9, the fill layer was deposited using the same deposition parameters as in step 8 except that the RF power was increased from about 200 W to about 500 W. Steps 10–12 are cool down and wafer removal steps. In comparison with the deposition parameters used in Example 1, the deposition parameters used in steps 8 and 9 were the same except that the magnet amperages were adjusted to accommodate the larger wafer. Steps 10–12 are cool down and wafer removal steps.

TABLE 1

| Step | 1 | 2 | 3 | 4 | 5 | 6 | 7 | 8 | 9 | 10 | 11 | 12 |
|---|---|---|---|---|---|---|---|---|---|---|---|---|
| Time (sec) | 5 | 5 | 5 | 30 | 2 | 8 | 2 | See Note 1 | See Note 2 | 10 | 30 | 5 |
| Pressure (torr) | 0.0000 | 0.0000 | 0.0000 | 0.0000 | 0.0000 | 0.0060 | 0.0060 | 0.0060 | 0.0060 | 0.0000 | 0.0000 | 0.0000 |
| RF (W) | 0.0 | 0.0 | 0.0 | 200.0 | 200.0 | 200.0 | 200.0 | 200.0 | 500.0 | 400.0 | 0.0 | 0.0 |
| RF Power Control | Deposit | Deposit | Deposit | Deposit | Deposit | Deposit | Deposit | Deposit | Deposit | Deposit | Deposit | Deposit |
| Microwave (W) | 0.0 | 0.0 | 1200.0 | 1200.0. | 1200.0 | 1200.0 | 1200.0 | 1200.0 | 1200.0 | 1200.0 | 1200.0 | 0.0 |
| Main Magnet (A) | 0.0 | 58.0 | 58.0 | 58.0 | 58.0 | 58.0 | 58.0 | 58.0 | 58.0 | 58.0 | 58.0 | 58.0 |
| Inner Magnet (A) | 0.0 | 23.3 | 23.3 | 23.3 | 23.3 | 23.3 | 23.3 | 23.3 | 23.3 | 23.3 | 23.3 | 23.3 |
| Outer Magnet (A) | 0.0 | 32.0 | 32.0 | 32.0 | 32.0 | 32.0 | 32.0 | 32.0 | 32.0 | 32.0 | 32.0 | 32.0 |
| ESC Voltage (V) | 0.0 | 0.0 | 0.0 | 0.0 | −200.0 | −300.0 | −300.0 | −300.0 | −300.0 | −200.0 | 0.0 | 0.0 |
| Helium Pressure | 0.0 | 0.0 | 0.0 | 0.0 | 0.0 | 3.0 | 0.0 | 0.0 | 0.0 | 0.0 | 0.0 | 0.0 |
| Wafer Temp (°C.) | 0.0 | 0.0 | 0.0 | 0.0 | 0.0 | 0.0 | 320.0 | 320.0 | 320.0 | 0.0 | 0.0 | 0.0 |
| $O_2$ (sccm) | 0.0 | 57.0 | 57.0 | 57.0 | 57.0 | 57.0 | 57.0 | 57.0 | 57.0 | 57.0 | 57.0 | 0.0 |
| Ar (sccm) | 0.0 | 40.0 | 40.0 | 40.0 | 40.0 | 40.0 | 40.0 | 40.0 | 40.0 | 40.0 | 40.0 | 0.0 |
| $SiH_4$ (sccm) | 10.0 | 0.0 | 0.0 | 0.0 | 0.0 | 0.0 | 0.0 | 39.0 | 39.0 | 0.0 | 0.0 | 0.0 |

[1]Deposition times for the protection layer were as follows: 60 sec for 300 mm, 80 sec for 400 mm, 100 sec for 500 mm, and 120 sec for 600 mm.
[2]Deposition times for the fill layer were as follows: 229 sec for 900 mm, 204 sec for 800 mm, 178 sec for 700 mm, and 153 sec for 600 mm.

Example 2

Two-layer $SiO_2$ graded gap fills including a protection layer and a fill layer of varying thicknesses were deposited

TABLE 2

| Step | 1 | 2 | 3 | 4 | 5 | 6 | 7 | 8 | 9 | 10 | 11 | 12 |
|---|---|---|---|---|---|---|---|---|---|---|---|---|
| Time (sec) | 5 | 5 | 5 | 30 | 2 | 8 | 2 | See Note 1 | See Note 2 | 10 | 30 | 5 |
| Pressure (torr) | 0.0000 | 0.0000 | 0.0000 | 0.0000 | 0.0000 | 0.0060 | 0.0060 | 0.0060 | 0.0060 | 0.0000 | 0.0000 | 0.0000 |
| RF (W) | 0.0 | 0.0 | 0.0 | 200.0 | 200.0 | 200.0 | 200.0 | 200.0 | 500.0 | 400.0 | 0.0 | 0.0 |
| RF Power Control | Deposit | Deposit | Deposit | Deposit | Deposit | Deposit | Deposit | Deposit | Deposit | Deposit | Deposit | Deposit |
| Microwave (W) | 0.0 | 0.0 | 1200.0 | 1200.0 | 1200.0 | 1200.0 | 1200.0 | 1200.0 | 1200.0 | 1200.0 | 1200.0 | 0.0 |
| Main Magnet (A) | 0.0 | 55.0 | 55.0 | 55.0 | 55.0 | 55.0 | 55.0 | 55.0 | 55.0 | 55.0 | 55.0 | 0.0 |
| Inner Magnet (A) | 0.0 | 51.0 | 51.0 | 51.0 | 51.0 | 51.0 | 51.0 | 51.0 | 51.0 | 51.0 | 51.0 | 0.0 |
| Outer Magnet (A) | 0.0 | 49.0 | 49.0 | 49.0 | 49.0 | 49.0 | 49.0 | 49.0 | 49.0 | 49.0 | 49.0 | 0.0 |
| ESC Voltage (V) | 0.0 | 0.0 | 0.0 | 0.0 | −200.0 | −300.0 | −300.0 | −300.0 | −300.0 | −200.0 | 0.0 | 0.0 |
| Helium Pressure | 0.0 | 0.0 | 0.0 | 0.0 | 0.0 | 3.0 | 0.0 | 0.0 | 0.0 | 0.0 | 0.0 | 0.0 |
| Wafer Temp (°C.) | 0.0 | 0.0 | 0.0 | 0.0 | 0.0 | 0.0 | 320.0 | 320.0 | 320.0 | 0.0 | 0.0 | 0.0 |
| $O_2$ (sccm) | 0.0 | 57.0 | 57.0 | 57.0 | 57.0 | 57.0 | 57.0 | 57.0 | 57.0 | 57.0 | 57.0 | 0.0 |
| Ar (sccm) | 0.0 | 40.0 | 40.0 | 40.0 | 40.0 | 40.0 | 40.0 | 40.0 | 40.0 | 40.0 | 40.0 | 0.0 |
| $SiH_4$ (sccm) | 10.0 | 0.0 | 0.0 | 0.0 | 0.0 | 0.0 | 0.0 | 39.0 | 39.0 | 0.0 | 0.0 | 0.0 |

[1]Deposition times for the protection layer were as follows: 60 sec for 300 mm, 80 sec for 400 mm, 100 sec for 500 mm, and 120 sec for 600 mm.
[2]Deposition times for the fill layer were as follows: 229 sec for 900 mm, 204 sec for 800 mm, 178 sec for 700 mm, and 153 sec for 600 mm.

Example 3

Three-layer $SiO_2$ graded gap fills including a protection layer, an intermediate layer, and a fill layer were deposited on a 6 inch wafer in an Epic ECR reactor. The recipe is shown below in Table 3. As mentioned above, steps 1–4 are stability and preheat steps. In step 8, the protection layer was deposited using, among other deposition parameters, a RF power of about 200 W and a microwave output of about 1200 W. In step 9, the intermediate layer was deposited using the same deposition parameters as in step 8 except that the RF power was increased from about 200 W to about 500 W. In step 10, the fill layer was deposited using, among other deposition parameters, a RF power of about 1600 W, a microwave output of about 1400 W, and increased $O_2$, Ar, and $SiH_4$ gas flows relative to those in steps 8 and 9. Steps 11 and 12 are cool down and wafer removal steps.

on an 8 inch wafer. The recipe is shown below in Table 4. It should be understood that at least some of the parameters presented in Table 4 have been calculated based on results obtained through performance and evaluation of actual depositions. As mentioned above, steps 1–4 are stability and preheat steps and steps 5–7 are transitional steps. In step 8, the protection layer was deposited using the same deposition parameters used in step 8 of Example 3 except that the magnet amperages were adjusted to accommodate the larger wafer. In step 9, the intermediate layer was deposited using the same deposition parameters as in step 8 except the RF power was increased from about 200 W to about 500 W. In step 10, the fill layer was deposited using the same deposition parameters used in step 10 of Example 3 except that the magnet amperages were adjusted to accommodate the larger wafer. Steps 11 and 12 are cool down and wafer removal steps.

TABLE 3

| Step | 1 | 2 | 3 | 4 | 5 | 6 | 7 | 8 | 9 | 10 | 11 | 12 |
|---|---|---|---|---|---|---|---|---|---|---|---|---|
| Time (sec) | 5 | 5 | 5 | 30 | 2 | 8 | 2 | See Note 1 | See Note 2 | See Note 3 | 10 | 30 |
| Prssure (torr) | 0.0000 | 0.0000 | 0.0000 | 0.0000 | 0.0000 | 0.0060 | 0.0060 | 0.0060 | 0.0060 | 0.0000 | 0.0000 | 0.0000 |
| RF (W) | 0.0 | 0.0 | 0.0 | 200.0 | 200.0 | 200.0 | 200.0 | 200.0 | 500.0 | 1600.0 | 400.0 | 0.0 |
| RF Power Control | Deposit | Deposit | Deposit | Deposit | Deposit | Deposit | Deposit | Deposit | Deposit | Deposit | Deposit | Deposit |
| Microwave (W) | 0.0 | 0.0 | 1200.0 | 1200.0 | 1200.0 | 1200.0 | 1200.0 | 1200.0 | 1200.0 | 1400.0 | 1200.0 | 1200.0 |
| Main Magnet (A) | 0.0 | 58.0 | 58.0 | 58.0 | 58.0 | 58.0 | 58.0 | 58.0 | 58.0 | 58.0 | 58.0 | 58.0 |
| Inner Magnet (A) | 0.0 | 23.3 | 23.3 | 23.3 | 23.3 | 23.3 | 23.3 | 23.3 | 23.3 | 23.3 | 23.3 | 23.3 |
| Outer Magnet (A) | 0.0 | 32.0 | 32.0 | 32.0 | 32.0 | 32.0 | 32.0 | 32.0 | 32.0 | 32.0 | 32.0 | 32.0 |
| ESC Voltage (V) | 0.0 | 0.0 | 0.0 | 0.0 | −200.0 | −300.0 | −300.0 | −300.0 | −300.0 | −600.0 | −200.0 | 0.0 |
| Helium Pressure | 0.0 | 0.0 | 0.0 | 0.0 | 0.0 | 3.0 | 0.0 | 0.0 | 0.0 | 0.0 | 0.0 | 0.0 |
| Wafer Temp (°C.) | 0.0 | 0.0 | 0.0 | 0.0 | 0.0 | 0.0 | 320.0 | 320.0 | 320.0 | 320.0 | 0.0 | 0.0 |
| $O_2$ (sccm) | 0.0 | 57.0 | 57.0 | 57.0 | 57.0 | 57.0 | 57.0 | 57.0 | 57.0 | 118.0 | 57.0 | 57.0 |
| Ar (sccm) | 0.0 | 40.0 | 40.0 | 40.0 | 40.0 | 40.0 | 40.0 | 40.0 | 40.0 | 120.0 | 40.0 | 40.0 |
| $SiH_4$ (sccm) | 10.0 | 0.0 | 0.0 | 0.0 | 0.0 | 0.0 | 0.0 | 39.0 | 39.0 | 78.0 | 0.0 | 0.0 |

[1]Deposition times for the protection layer were as follows: 60 sec for 300 mm, 80 sec for 400 mm, 100 sec for 500 mm, and 120 sec for 600 mm.
[2]Deposition times for the intermediate layer were as follows: 229 sec for 900 mm, 204 sec for 800 mm, 178 sec for 700 mm, and 153 sec for 600 mm.
[3]Deposition times for the fill layer were as follows: 60 sec for 450 mm and 120 sec for 900 mm.

Example 4

Three-layer $SiO_2$ graded gap fills including a protection layer, an intermediate layer, and a fill layer were deposited

TABLE 4

| Step | 1 | 2 | 3 | 4 | 5 | 6 | 7 | 8 | 9 | 10 | 11 | 12 |
|---|---|---|---|---|---|---|---|---|---|---|---|---|
| Time (sec) | 5 | 5 | 5 | 30 | 2 | 8 | 2 | See Note | See Note | See Note | 10 | 30 |
| Pressure (torr) | 0.0000 | 0.0000 | 0.0000 | 0.0000 | 0.0000 | 0.0060 | 0.0060 | 0.0060 | 0.0060 | 0.0000 | 0.0000 | 0.0000 |
| RF (W) | 0.0 | 0.0 | 0.0 | 200.0 | 200.0 | 200.0 | 200.0 | 200.0 | 500.0 | 1600.0 | 400.0 | 0.0 |
| RF Power Control | Deposit | Deposit | Deposit | Deposit | Deposit | Deposit | Deposit | Deposit | Deposit | Deposit | Deposit | Deposit |
| Microwave (W) | 0.0 | 0.0 | 1200.0 | 1200.0 | 1200.0 | 1200.0 | 1200.0 | 1200.0 | 1200.0 | 1400.0 | 1200.0 | 1200.0 |
| Main Magnet (A) | 0.0 | 55.0 | 55.0 | 55.0 | 55.0 | 55.0 | 55.0 | 55.0 | 55.0 | 55.0 | 55.0 | 55.0 |
| Inner Magnet (A) | 0.0 | 51.0 | 51.0 | 51.0 | 51.0 | 51.0 | 51.0 | 51.0 | 51.0 | 51.0 | 51.0 | 51.0 |
| Outer Magnet (A) | 0.0 | 49.0 | 49.0 | 49.0 | 49.0 | 49.0 | 49.0 | 49.0 | 49.0 | 49.0 | 49.0 | 49.0 |
| ESC Voltage (V) | 0.0 | 0.0 | 0.0 | 0.0 | −200.0 | −300.0 | −300.0 | −300.0 | −300.0 | −600.0 | −200.0 | 0.0 |
| Helium Pressure | 0.0 | 0.0 | 0.0 | 0.0 | 0.0 | 3.0 | 0.0 | 0.0 | 0.0 | 0.0 | 0.0 | 0.0 |
| Wafer Temp (°C.) | 0.0 | 0.0 | 0.0 | 0.0 | 0.0 | 0.0 | 320.0 | 320.0 | 320.0 | 320.0 | 0.0 | 0.0 |
| $O_2$ (sccm) | 0.0 | 57.0 | 57.0 | 57.0 | 57.0 | 57.0 | 57.0 | 57.0 | 57.0 | 118.0 | 57.0 | 57.0 |
| Ar (sccm) | 0.0 | 40.0 | 40.0 | 40.0 | 40.0 | 40.0 | 40.0 | 40.0 | 40.0 | 120.0 | 40.0 | 40.0 |
| $SiH_4$ (sccm) | 10.0 | 0.0 | 0.0 | 0.0 | 0.0 | 0.0 | 0.0 | 39.0 | 39.0 | 78.0 | 0.0 | 0.0 |

[1]Deposition times for the protection layer were as follows: 60 sec for 300 mm, 80 sec for 400 mm, 100 sec for 500 mm, and 120 sec for 600 mm.
[2]Deposition times for the intermediate layer were as follows: 229 sec for 900 mm, 204 sec for 800 mm, 178 sec for 700 mm, and 153 sec for 600 mm.
[3]Deposition times for the fill layer were as follows: 60 sec for 450 mm and 120 sec for 900 mm.

It should be noted that in Examples 1 and 2 the fill layers were deposited using a RF power of about 500 W whereas in Examples 3 and 4 the fill layers were deposited using a RF power of about 1600 W. The reason for this difference is that reduced gas flows were used in Examples 1 and 2 (e.g., about 39 sccm of $SiH_4$ in Examples 1 and 2 versus about 78 sccm of $SiH_4$ in Examples 3 and 4). Accordingly, less RF power was required to deposit the fill layer in Examples 1 and 2 than in Examples 3 and 4.

While this invention has been described in terms of several preferred embodiments, there are alterations, permutations, and equivalents which fall within the scope of this invention. It should also be noted that there are many alternative ways of implementing the methods and devices of the present invention. It is therefore intended that the following claims be interpreted as including all such alterations, permutations, and equivalents as fall within the true spirit and scope of the present invention.

What is claimed is:

1. In a high density plasma processing chamber, a method of depositing an insulating layer on a substrate, said insulating layer being disposed above a first layer having trenches formed therein and below a subsequently deposited second layer, said method comprising:

depositing a protection layer above said first layer using a first set of deposition parameters having a first $J_i$, said protection layer coating a surface of said first layer in a substantially conformal manner without forming voids in said trenches; and depositing a fill layer above said protection layer using a second set of deposition parameters having a second $J_i$, wherein said first set of deposition parameters is selected to reduce plasma charge-related damage relative to said second set of deposition parameters and said first $J_i$ is reduced relative to said second $J_i$, said first $J_i$ being reduced relative to said second $J_i$ by increasing a pressure in a processing chamber during deposition of said protection layer relative to a pressure in a processing chamber during deposition of said fill layer, and wherein the combination of said protection layer and said fill layer sufficiently electrically isolates said first layer from said second layer.

2. The method of claim 1, wherein the pressure in the processing chamber during deposition of the protection layer is increased to between about 6 mtorr and about 10 mTorr.

3. The method of claim 1, wherein the thickness of the protection layer is about 20% of the total thickness of the insulating layer.

4. The method of claim 1, wherein the protection layer has a thickness of about 200 nm to about 300 nm.

5. In a high density plasma processing chamber, a method of depositing an insulating layer on a substrate, said insulating layer being disposed above a first layer having trenches formed therein and below a subsequently deposited second layer, said method comprising:

depositing a protection layer above said first layer using a first set of deposition parameters having a first $J_i$, said protection layer coating a surface of said first layer in a substantially conformal manner without forming voids in said trenches;

depositing an intermediate layer above said protection layer using a third set of deposition parameters; and depositing a fill layer above said intermediate layer using a second set of deposition parameters having a second $J_i$, wherein said first set of deposition parameters is selected to reduce plasma charge-related damage relative to said second set of deposition parameters and said first $J_i$ is reduced relative to said second $J_i$, said first $J_i$ being reduced relative to said second $J_i$ by increasing a pressure in a processing chamber during deposition of said protection layer relative to a pressure in a processing chamber during deposition of said fill layer, wherein said third set of deposition parameters is selected to increase throughput relative to said first set of deposition parameters, and wherein the combination of said protection layer, said intermediate layer, and said fill layer sufficiently electrically isolates said first layer from said second layer.

6. The method of claim 5, wherein the pressure in the processing chamber during deposition of the protection layer is increased to between about 6 mTorr and about 10 mTorr.

7. The method of claim 5, wherein the combined thickness of the protection layer and the intermediate layer is about 20% of the total thickness of the insulating layer.

8. The method of claim 5, wherein the protection layer and the intermediate layer each have a thickness of about 10% of the total thickness of the insulating layer.

* * * * *